United States Patent
Wieczorek et al.

(10) Patent No.: US 6,620,718 B1
(45) Date of Patent: Sep. 16, 2003

(54) METHOD OF FORMING METAL SILICIDE REGIONS ON A GATE ELECTRODE AND ON THE SOURCE/DRAIN REGIONS OF A SEMICONDUCTOR DEVICE

(75) Inventors: Karsten Wieczorek, Reichenberg-Boxdorf (DE); Michael Raab, Radebeul (DE); Rolf Stephan, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/557,713

(22) Filed: Apr. 25, 2000

(51) Int. Cl.⁷ ................... H01L 21/3205; H01L 21/336
(52) U.S. Cl. ....................................... 438/592; 438/303
(58) Field of Search ............................... 438/297, 303, 438/592, 296, 532, 533, 304, 305, 300, 683, 586; 257/E21.165

(56) References Cited

U.S. PATENT DOCUMENTS

| | | | |
|---|---|---|---|
| 4,897,368 A | | 1/1990 | Kobushi et al. ............ 437/200 |
| 5,034,348 A | | 7/1991 | Hartswick et al. .......... 437/200 |
| 5,352,631 A | * | 10/1994 | Sitaram et al. ............. 438/300 |
| 5,434,096 A | * | 7/1995 | Chu et al. .......... 148/DIG. 147 |
| 5,447,875 A | | 9/1995 | Moslehi ....................... 437/41 |
| 5,937,300 A | * | 8/1999 | Sekine et al. ............... 438/300 |
| 6,074,922 A | * | 6/2000 | Wang et al. ................. 438/303 |
| 6,184,117 B1 | * | 2/2001 | Lu ............................... 438/592 |
| 6,268,295 B1 | * | 7/2001 | Ohta et al. .................. 438/735 |
| 6,271,133 B1 | * | 8/2001 | Lim et al. .................... 438/683 |

OTHER PUBLICATIONS

Goto et al., "Optimization of Salicide Processes for Sub 0.1-μCMOS Devices," *1994 Symposium on VLSI Technology Digest of Technical Papers*, pp. 119–120, Apr. 1994.
Sohn et al., "High Thermal Stability and Low Junction Leakage Current of Ti Capped Co Salicide and its Feasibility for High Thermal Budget CMOS Devices," Mar. 1998.
Goto et al., "A New Leakage Mechanism of Co Salicide and Optimized Process Conditions," *IEEE Transactions on Electron Devices*, vol. 46, No. 1, p. 117, Jan. 1999.

* cited by examiner

Primary Examiner—William David Coleman
Assistant Examiner—Brook Kebede
(74) Attorney, Agent, or Firm—Williams, Morgan & Amerson, P.C.

(57) ABSTRACT

The present invention is directed to a method of forming metal silicide regions on a gate electrode (23) and on the source/drain regions (25) of a semiconductor device (100). In one illustrative embodiment, the method comprises forming a gate stack (17) above a semiconducting substrate (20), the gate stack (17) being comprised of a gate electrode (23) and a protective layer (24), forming a plurality of source/drain regions (25) in the substrate (20), and forming a first metal silicide region (28) above each of the source/drain regions (25). The method further comprises removing the protective layer (24) from above the gate electrode (23) and forming a second metal silicide region (31) above the gate electrode (23).

21 Claims, 3 Drawing Sheets

METHOD OF FORMING METAL SILICIDE REGIONS ON A GATE ELECTRODE AND ON THE SOURCE/DRAIN REGIONS OF A SEMICONDUCTOR DEVICE

BACKGROUND OF THE INVENTION

1. Field of the Invention

The present invention is generally related to semiconductor devices and manufacturing processes, and, more particularly, to a method of forming metal silicide regions on a gate electrode and above the source/drain regions of a semiconductor device.

2. Description of the Related Art

In standard semiconductor processing methods, a salicide forming process (self-aligned silicide forming process) is used for simultaneously forming metal silicide regions on the gate electrode and the source/drain regions of a semiconductor device. FIGS. 1A–1C show one example of this prior art salicide forming process.

FIG. 1A shows a cross-section of a semiconductor device 20 prior to the formation of the metal silicide regions. The illustrative semiconductor device 20 has been formed by conventional techniques. The semiconductor device 20 is comprised of a gate insulation layer 5, a gate electrode 4, sidewall spacers 6, and source/drain regions 3. The various components may be formed by a variety of known techniques. For example, the trench isolations 2 may be formed by traditional trench isolation techniques. The gate electrode 4 and gate insulation layer 5 may be manufactured by forming layers of the appropriate materials, and, thereafter, patterning the layers using known photolithographic and etching techniques. The sidewall spacers 6 may be formed by depositing a layer of the spacer material, and, thereafter, performing an anisotropic etching process. The source/drain regions 3 may be formed by one or more ion implantation steps in which dopant atoms are implanted into the substrate 1.

FIG. 1B depicts the first step of the process for forming metal silicide regions on the gate electrode 4 and the source/drain regions 3. In this step, a thin refractory metal layer 7 is blanket deposited above the partially-formed semiconductor device. An initial rapid thermal anneal (RTA) process is performed for forming a metastable metal silicide in the regions where the refractory metal layer 7 is in direct contact with an underlying silicon layer. During the initial RTA process, the metal atoms of the refractory metal layer 7 penetrate into the underlying silicon layers and combine with the silicon. The penetration depth is controlled by the initial thickness of the refractory metal layer, and the temperature and time of the initial RTA process.

In the next step, as shown in FIG. 1C, the portion of the refractory metal layer 7 which has not been transformed into metastable metal silicide layers during the initial RTA process is removed by a metal etching process, such as a dilute acid bath. After etching, the gate silicide region 8 on top of the gate electrode 4 and the source/drain silicide regions 9 covering the source/drain regions 3 are exposed. Then, a final RTA process is performed to transform the initially formed metastable metal silicide regions 8, 9 into the chemically stable form of the metal silicide.

The thickness of the metal silicide regions 9 formed above the source/drain region 3 is adjusted in order to maintain the integrity of the shallow source/drain junctions. Since the metal silicide regions 8, 9 are formed in the same salicide process, this results in a relatively thin, and therefore less conductive, gate metal silicide region 9. Therefore, the ability to optimize the gate sheet resistance is limited. Moreover, the lower conductivity of the gate electrode 4, as provided by this conventional method, tends to limit the switching speed of the semiconductor device.

The present invention is directed to a method of making a semiconductor device that solves, or at least reduces, some or all of the aforementioned problems.

SUMMARY OF THE INVENTION

In one aspect, the present invention is directed to a method of forming metal silicide regions on a gate electrode and on the source/drain regions of a semiconductor device. In one illustrative embodiment, the method comprises forming a gate stack above a semiconducting substrate, the gate stack being comprised of a gate electrode and a protective layer, forming a plurality of source/drain regions in the substrate, and forming a first metal silicide region above each of the source/drain regions. The method further comprises removing the protective layer from above the gate electrode and forming a second metal silicide region above the gate electrode.

In another aspect, the method comprises forming a gate stack comprised of a gate electrode forming a plurality of source/drain regions in the substrate adjacent the gate stack, and forming a first metal silicide region on each of the source/drain regions. The method further comprises forming a layer of silicon dioxide on each of the first metal silicide regions by performing an anneal process in an oxygen-containing environment and forming a second metal silicide region above the gate electrode after forming the layer of silicon dioxide above each of the source/drain regions.

BRIEF DESCRIPTION OF THE DRAWINGS

The invention may be understood by reference to the following description taken in conjunction with the accompanying drawings, in which like reference numerals identify like elements, and in which.

Figure 1A:
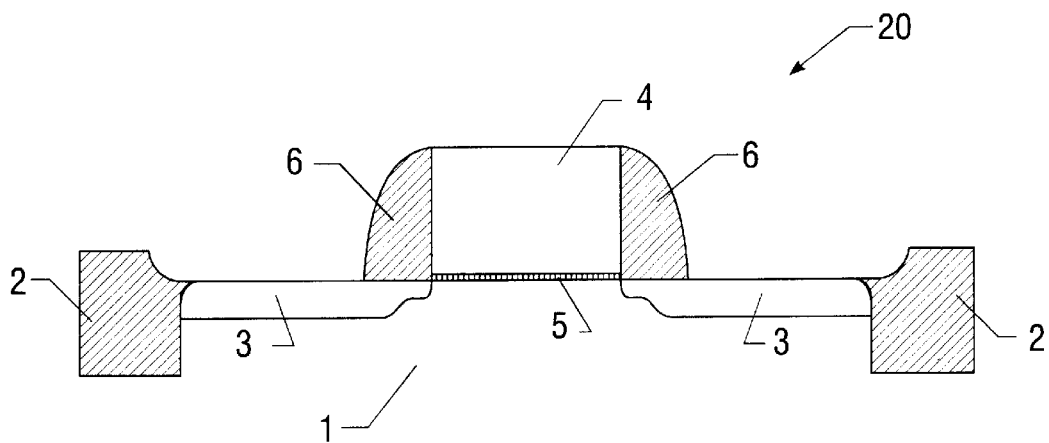
FIGS. 1A–1C are cross-sectional view of a semiconductor device illustrating a conventional fabrication process for forming metal silicide regions above the gate electrode and the source/drain regions of a semiconductor device.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to FIGS. 2A–2F. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features depicted in the drawings may be exaggerated or reduced as compared to the size of those feature sizes on fabricated devices. Nevertheless, the attached drawings are included to describe and explain illustrative examples of the present invention.

In general, the present invention is directed to a method of forming metal silicide regions on a gate electrode and on the source/drain regions of a semiconductor device. The metal silicide regions have different thicknesses, and they may also be comprised of the same or different metal silicides. As will be readily apparent to those skilled in the art upon a complete reading of the present application, the present method is applicable to a variety of technologies, e.g., NMOS, PMOS, CMOS, etc., is readily applicable to a variety of devices, including, but not limited to, logic devices, memory devices, etc.

Figure 2A:
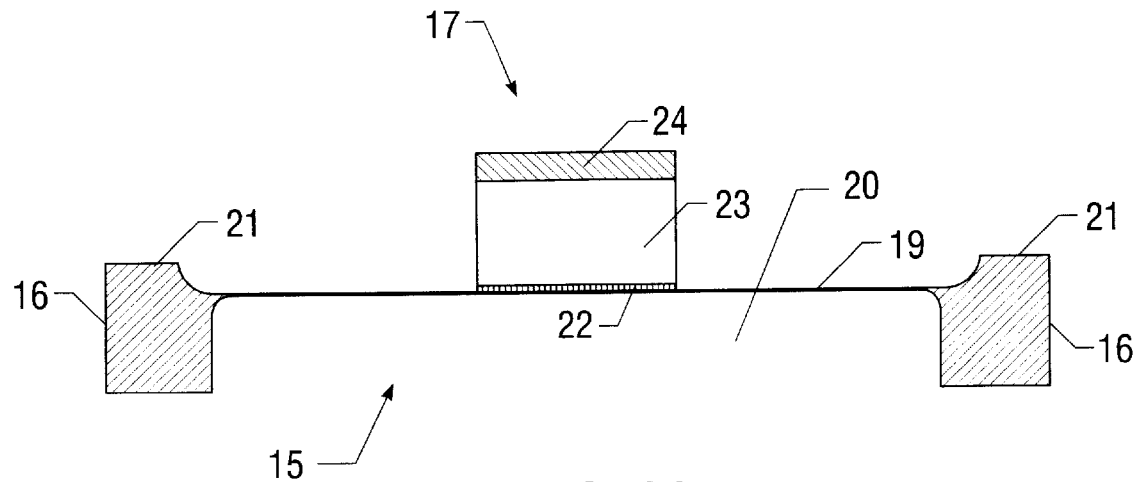
FIGS. 2A–2F depict various cross-sectional view of a semiconductor device fabricated in accordance with one illustrative embodiment of the present invention.
Figure 2B:
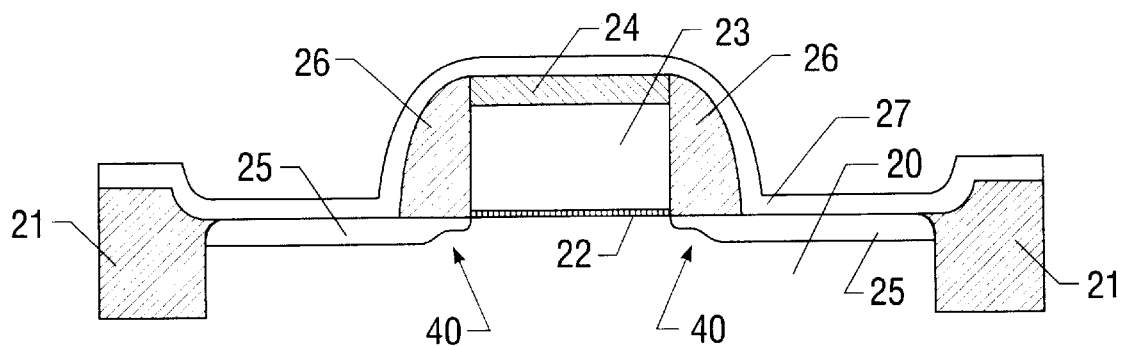
Figure 2C:
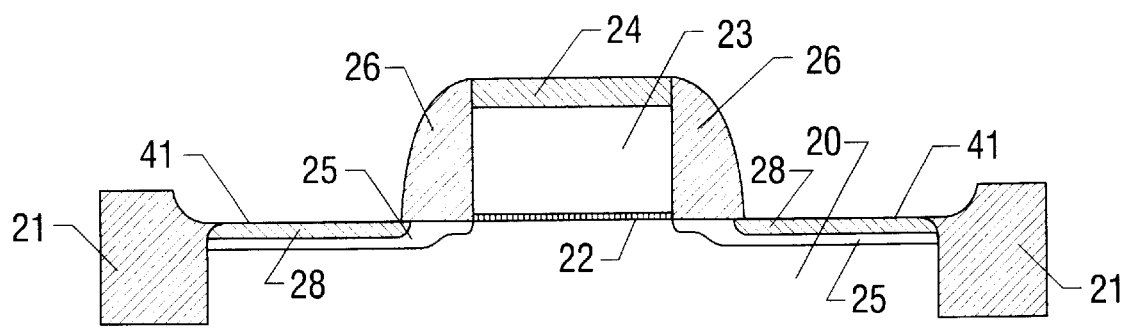
Figure 2D:
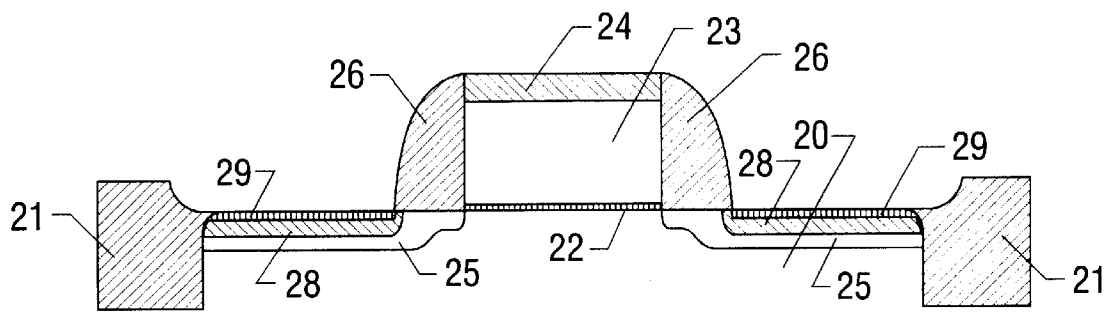
Figure 2E:
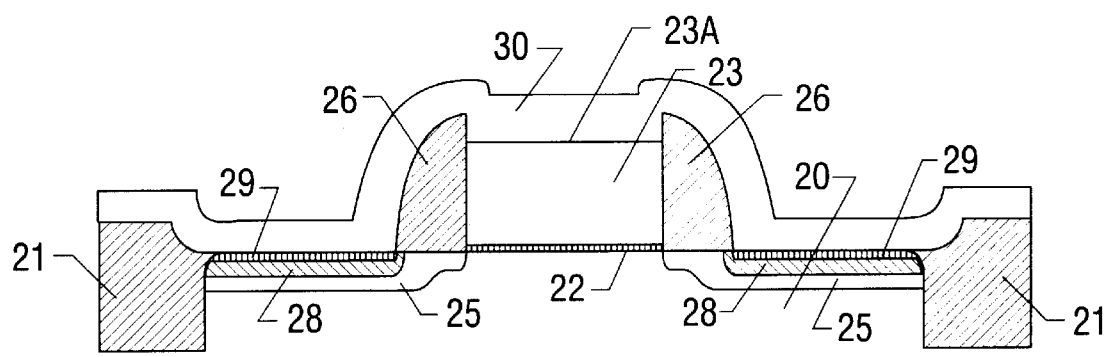
Figure 2F:
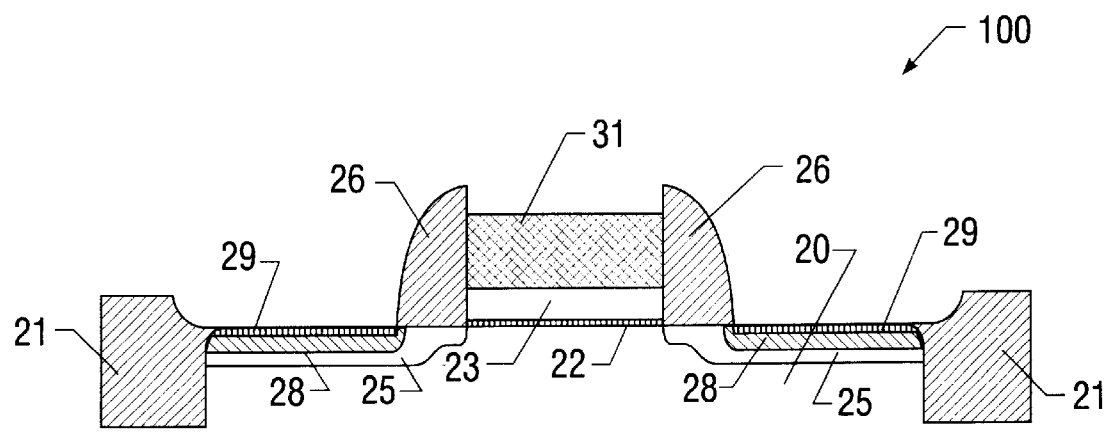

FIGS. 2A–2F depict an illustrative process flow for forming a field effect transistor 100 (see FIG. 2F) above a surface 19 of a semiconducting substrate 20. The substrate 20 may be comprised of a variety of materials, such as a doped silicon. Although the transistor 100 depicted in FIG. 2F is an NMOS transistor, the present invention is not limited to any particular technology. As shown in FIG. 2A, a plurality of trench isolations 21 are formed in the substrate 20 and thereby define an active area 15 in which the semiconductor device 100 will be formed. The trench isolations 21 may be formed from a variety of materials, e.g., silicon dioxide, silicon oxynitride, etc., and they may be formed using a variety of known techniques. For example, the trench isolations 21 may be formed by performing an anisotropic etching process to define a trench 16 in the substrate 20, and, thereafter, silicon dioxide may be deposited in the trench 16.

Next, as shown in FIG. 2A, a gate stack 17 comprised of at least a gate insulation layer 22, a gate electrode 23, and a protective layer 24 is formed above the semiconducting substrate 20. These various components may be comprised of a variety of materials, and may be formed by a variety of techniques. The gate stack 17 depicted in FIG. 2A may be formed by forming various process layers of the appropriate material above the substrate 20, and, thereafter, patterning the various layers using known photolithography and etching techniques.

For example, the gate insulation layer 22 may be comprised of silicon dioxide, silicon oxynitride, silicon nitride, or any other material useful as a gate insulation layer. The gate insulation layer 22 may also be formed by a variety of techniques, such as thermal growth, physical vapor deposition ("PVD"), chemical vapor deposition ("CVD"), etc. In one illustrative embodiment, the gate insulation layer 22 is comprised of a thermally grown layer of silicon dioxide having a thickness ranging from approximately 15–50 Å.

Similarly, the gate electrode 23 may be comprised of a variety of materials, and it may be formed using a variety of known techniques. For example, the gate electrode 23 may be comprised of polycrystalline silicon (polysilicon), amorphous silicon, or microcrystalline silicon, and it may be formed by a variety of techniques, such as PVD, plasma enhanced CVD (PECVD), CVD, sputtering, etc. In one illustrative embodiment, the gate electrode 23 is comprised of approximately 1000–4000 Å of polysilicon that is formed by a CVD process.

Next, as shown in FIG. 2A, a protective layer 24 is formed above the gate electrode 23. The protective layer 23 may be comprised of a variety of materials, and it may be formed by a variety of techniques, e.g., PECVD, CVD, sputtering, etc. The protective layer 24 may be an organic or inorganic material. For example, for the method according to the present invention, it may be preferable to use a non-oxidizable layer of material, e.g., a silicon nitride compound ($Si_xN_y$, referred to as silicon nitride (SiN) in the following description). In fact, the protective layer 24 may be comprised of an anti-reflective coating (ARC) material, e.g., silicon nitride, that may be used in the photolithography processes used in conjunction with patterning the gate electrode 23. In one illustrative embodiment, the protective layer 24 is present invention, the protective layer 24 is not removed after patterning operations that result in the formation of the gate electrode 23 and gate insulation layer 22. Rather, as will be described more fully below, the protective layer 24 is used as a silicide-blocking coating to prevent the formation of a metal silicide above the gate electrode 23 during the process of Thereafter, traditional processing techniques may be used to form the sidewall spacers 26 and the source/drain regions 25 depicted in FIG. 2B. For example, after the gate stack 17 is formed, an initial ion implant process may be performed to form the extensions 40 of the source/drain regions 25 depicted in FIG. 2B. Next, the sidewall spacers 26 may be formed by blanket depositing a layer of the spacer material, e.g., silicon dioxide, silicon oxynitride, silicon nitride, etc., and, thereafter, performing an anisotropic etching process to result in the spacers 26 depicted in FIG. 2B. Lastly, a second ion implantation process may be performed at a higher dopant concentration to produce the final source/drain regions 25 depicted in FIG. 2B. After the implant processes are performed, the device may be subjected to a rapid thermal anneal process to activate the dopants and to heal the damage to the lattice structure of the substrate 20 that resulted from the implantation processes.

Next, as shown in FIG. 2B, a layer of refractory metal 27 is formed above the substrate 20, i.e., above the source/drain regions 25, the sidewall spacers 26, and the protective layer 24. The refractory metal layer 27 may be comprised of a variety of materials that may subsequently be converted to a metal silicide. For example, the refractory metal layer 27 may be comprised of cobalt, titanium, tantalum, tungsten, molybdenum, zirconium, platinum, nickel, etc. The refractory metal layer 27 may be formed by a variety of known techniques for forming such layers, such as, for example, PVD, PECVD, sputtering, low pressure chemical vapor deposition (LPCVD), etc. Additionally, the thickness of the refractory metal layer 27 may be varied as a matter of design choice, e.g., the refractory metal layer 27 may range in thickness from approximately 50–200 Å. In one illustrative embodiment, the refractory metal layer 27 is comprised of cobalt having a thickness ranging from approximately 50–200 Å that is formed by a PVD process.

As shown in FIG. 2C, portions of the refractory metal layer 27 are then converted to metal silicide regions 28 above each of the source/drain regions 25 using known silicidation processing techniques. The thickness of the metal silicide regions 28 may be varied as a matter of design choice. However, using current generation technology, the metal silicide regions 28 may have a thickness ranging from approximately 150–750 Å. Additionally, it should be noted that during the process of forming the metal silicide regions 28, portions of the source/drain regions 25 are consumed.

The refractory metal layer 27 may be converted to a metal silicide by performing at least one anneal process, and in one example, by performing two rapid thermal anneal (RTA) processes. A first RTA process may be performed at a temperature ranging from approximately 450–600° C. for a duration of approximately 15–60 seconds, preferably in a gas ambient of nitrogen ($N_2$) gas. Next, unreacted portions of the refractory metal layer 27 are removed by, for example, a dilute acid bath comprised of hydrochloric acid and peroxide or sulfuric acid and peroxide. Thereafter, a second rapid thermal anneal process at a temperature ranging from approximately 750–900° C. may be performed for a duration of approximately 30–60 seconds to complete the formation of the metal silicide regions 28.

During the first rapid thermal anneal (RTA) process, a metal silicide, e.g., cobalt silicide, is formed where the refractory metal layer 27 is in direct contact with an underlying doped or undoped silicon layer. During this process, metal atoms, e.g., cobalt atoms, penetrate into the surface region of the underlying silicon layer and react with the silicon atoms to form a metastable silicide, e.g., cobalt silicide (CoSi). The first RTA process results in metastable metal silicide regions 28 having a thickness which is controlled by the thickness of the refractory metal layer 27, as well as the temperature and processing time of the first process.

During the course of the second RTA process, which is initially performed in an inert gas ambient, such as a nitrogen ($N_2$) gas ambient, oxygen ($O_2$) gas may be mixed with nitrogen ($N_2$). The oxygen penetrates into the surface 41 of the exposed metal silicide regions 28 and reacts with the silicon atoms to selectively form silicon dioxide ($SiO_2$) layers 29 above the metal silicide regions 28, as depicted in FIG. 2D. The silicon dioxide layers 29 may have a thickness ranging from approximately 20–100 Å. In the disclosed illustrative embodiment, the silicon dioxide layer 29 covers substantially all of the metal silicide region 28. Thus, in the situation where the metal silicide region 28 is comprised of cobalt, cobalt atoms in the surface regions are set free which then diffuse into and through the first metal silicide region 28 to the underlying metal silicide/substrate ($CoSi_2$/Si) interface. At this interface, the cobalt atoms form cobalt silicide ($CoSi_2$) again. In effect, the metal silicide regions 28 are "pushed" into the substrate by an amount given by the oxide thickness. In other embodiments of the method according to the present invention, the addition of oxygen during the first RTA process may be modified. Instead of oxygen gas, oxygen may be added in the form of an oxygen containing gas, such as NO, $N_2O$, etc. The inert gas may be continuously or abruptly replaced by the oxygen containing gas instead of adding the oxygen containing gas to the inert gas. Also the total first high temperature RTA process may be performed using an oxygen containing gas. Alternatively, the anneal process that is used to form the silicon dioxide layer 29 may be an anneal process that is separate from any anneal process used to form the metal silicide regions 28. The anneal process may be performed at a temperature ranging from approximately 750–900° C.

Next, as shown in FIG. 2E, the protective layer 24 is removed by performing an etching process that is selective with respect to the sidewall spacers 26 comprised of, for example, silicon dioxide or silicon oxynitride, the gate electrode 23, and the silicon dioxide layers 29. By removing the protective layer 24, a top surface 23A of the gate electrode 23 is exposed for further processing.

Thereafter, as shown in FIG. 2E, a second layer of refractory metal 30 may be formed above the device, i.e., above the sidewall spacers 26, the source/drain regions 25, and the top surface 23A of the gate electrode 23. The second layer of refractory metal 30 may be comprised of any metal that may subsequently be converted into a metal silicide. For example, the second layer of refractory metal 30 may be comprised of cobalt, tantalum, platinum, tungsten, molybdenum, or nickel. The thickness of the second layer of refractory metal 30 may be varied as a matter of design choice, but it will usually have a thickness ranging from approximately 200–2000 Å, and it may be formed by any of a variety of known techniques for forming such layers, e.g., PVD, CVD, etc. In one illustrative embodiment, the second layer of refractory metal 30 is comprised of cobalt having a thickness ranging from approximately 200–2000 Å that is formed by a PVD process.

Thereafter, at least a portion of the second layer of refractory metal 30 is converted to a metal silicide region 31 by performing one or more anneal processes. In particular, during the anneal process, portions of the second layer of refractory metal 30 in contact with the surface 23A of the gate electrode 23 are converted to a metal silicide region 31 (see FIG. 2F). Portions of the second refractory metal layer 30 that are unreacted during this conversion process may be removed by a subsequent acid rinse to result in the structure depicted in FIG. 2F.

The particular parameters of the anneal processes used to form the metal silicide region 31 are matters of design choice, and they may vary depending upon the thickness and composition of the second layer of refractory metal 30. The anneal process may be comprised of a two-step anneal processes in a rapid thermal anneal chamber. The duration and temperatures of the anneal process may be varied as a matter of design choice to insure that the second layer of refractory metal 30 reaches the appropriate temperature. In one illustrative example, where the second layer of refractory metal 30 is comprised of approximately 200–2000 Å of cobalt, the anneal process may be comprised of a first step at about 450–600° C. for a duration of approximately 10–90 seconds, and a second step at about 750–900° C. for a duration of approximately 10–90 seconds.

As is clear from the foregoing, the first and second layers of refractory metal 27, 30 may be comprised of the same or different refractory metals. For example, the first layer of refractory metal 27 may be comprised of cobalt, while the second layer of refractory metal 30 may be comprised of nickel. Alternatively, both the first and second layers of refractory metal 27, 30 may be comprised of the same material, e.g., cobalt. Moreover, the thickness of the first and second layers of refractory metal 27, 30 may be very different.

Through use of the present invention, a transistor may be formed such that the metal silicide region 31 above the gate electrode 23 is of a different composition than that of the metal silicide regions 28 formed on the source/drain regions 25. For example, the metal silicide region 31 formed above the gate electrode 23 may be comprised of nickel silicide ($NiSi_2$) while the metal silicide regions 28 formed above the source/drain region 25 may be comprised of cobalt silicide ($CoSi_2$).

Formation of the metal silicide regions 31, 28 from different materials may be advantageous for a number of reasons. For example, the metal silicide regions 31, 28 may be formed of different materials so as to enhance the performance of the transistor. That is, since the metal silicide region 31 will not be exposed to the source/drain regions 25, it may be made very thick and without concern for the amount of the source/drain regions 25 it would otherwise consume were the transistor fabricated using traditional silicide processing. In one illustrative embodiment, the metal silicide region 31 may be comprised of titanium silicide or nickel silicide so as to take advantage of its lower resistance as compared to that of other suicides, e.g., cobalt silicide, etc. In a similar vein, the metal silicide regions 28 may be made of a silicide that is less aggressive in attacking the source/drain region 25, e.g. cobalt silicide.

Moreover, in the present invention, the metal silicide regions 31 and 28 may be very different in thickness. This is advantageous in that, even if the metal silicide regions 31 and 28 are made of the same material, the metal silicide region 31 may be made much thicker than that of the metal silicide region 28 on the source/drain regions 25. The resulting transistor has improved electrical performance because the resistance of the gate electrode 23 is reduced, due to the increase in size of the metal silicide region 31, while the metal silicide regions 28 may be made much thinner, thereby avoiding excessive consumption of the source/drain regions 25.

Figure 1B:
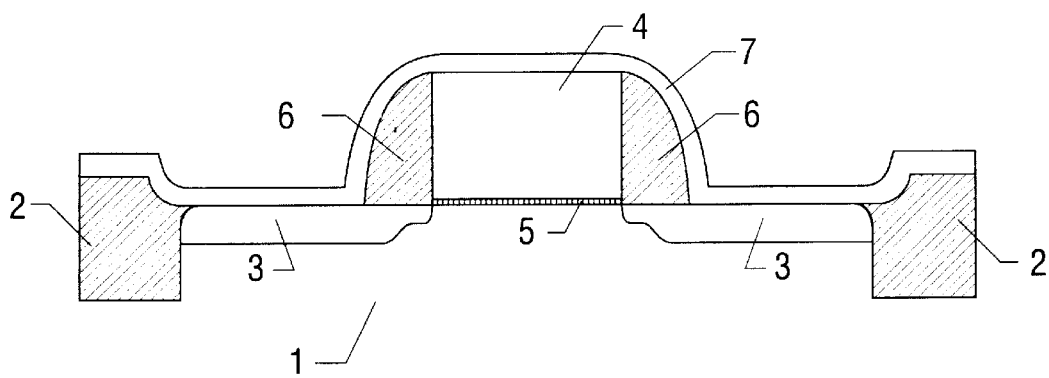
Figure 1C:
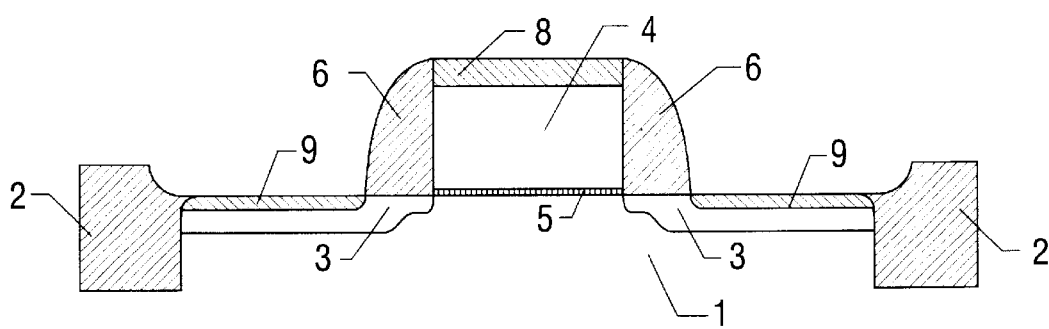

By way of example, in the situation where the first layer of refractory metal 27 has a thickness ranging from approximately 50–200 Å, and the second layer of refractory metal 30 has a thickness ranging from approximately 200–2000 Å, the metal silicide region 31 may have a thickness ranging from approximately 700–3500 Å, and the metal silicide regions 28 may have a thickness ranging from approximately 150–750 Å. That is, the ratio of the thickness of the metal silicide region 31 as compared to that of the metal silicide regions 28 may vary between about 2–10. This is in contrast to prior art transistors (see FIGS. 1A–1C) which resulted in the metal silicide region 8 above the gate electrode 4 having a thickness that was approximately the same as the thickness of the metal silicide regions 9 formed on the source/drain regions 3 (see FIGS. 1A–1C). A device having the above-described thickness ratios between the various silicide regions produces a transistor with enhanced electrical performance characteristics as described above.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a gate stack above a semiconducting substrate, said gate stack comprised of a gate electrode and a protective layer positioned above said gate electrode;
    forming a plurality of source/drain regions in said substrate;
    forming a first layer of refractory metal above said source/drain region and said protective layer;
    performing at least one anneal process to convert a portion of said first layer of refractory metal to a first metal silicide region on each of said source/drain regions;
    introducing an oxygen containing gas during at least some portion of said at least one anneal process to form a layer of silicon dioxide above each of said first metal silicide regions to thereby free at least some metal atoms in the first metal silicide regions to diffuse through at least a portion of said first metal silicide regions and form a metal silicide at an interface between the substrate and the first metal silicide regions;
    removing said protective layer from above said gate electrode after forming said first metal silicide regions;
    forming a second layer of refractory metal above said gate electrode after removing said protective layer; and
    performing at least one anneal process to convert a portion of said second layer of refractory metal to a second metal silicide region above said gate electrode.

2. The method of claim 1, wherein forming a gate stack above a semiconducting substrate, said gate stack comprised of a gate electrode and a protective layer positioned above said gate electrode, comprises:
    forming a layer of polysilicon above a surface of a substrate;
    forming a protective layer above said gate electrode layer; and
    patterning said layer of polysilicon and said protective layer to define a gate stack comprised of a gate electrode and a protective layer above said gate electrode.

3. The method of claim 2, wherein forming a protective layer above said gate electrode layer comprises forming a protective layer comprised of at least one of silicon nitride and silicon oxynitride above said gate electrode layer.

4. The method of claim 1, wherein forming a plurality of source/drain regions in said substrate comprises performing at least one ion implantation process to form a plurality of source/drain regions on said substrate.

5. The method of claim 1, wherein forming a first layer of refractory metal above said source/drain region and said protective layer comprises forming a first layer of refractory metal comprised of at least one of cobalt, titanium, tantalum, tungsten, molybdenum, zirconium, platinum, and nickel above said source/drain region and said protective layer.

6. The method of claim 1, wherein removing said protective layer from above said gate electrode after forming said first metal silicide regions comprises performing a selective etching process to remove said protective layer from above said gate electrode after forming said first metal silicide regions.

7. The method of claim 1, wherein said layer of silicon dioxide above each of said first metal silicide regions covers substantially all of each of said first metal silicide regions.

8. The method of claim 1, wherein performing at least one anneal process comprises performing a rapid thermal anneal process at a temperature ranging from approximately 750–900° C. in an oxygen-containing environment.

9. The method of claim 1, wherein forming a second metal silicide region above said gate electrode comprises forming a second metal silicide region above said gate electrode, said second metal silicide region being of the same composition as said first metal silicide regions.

10. The method of claim 1, wherein forming a second metal silicide region above said gate electrode comprises forming a second metal silicide region above said gate electrode, said second metal silicide region being of a different composition as said first metal silicide region.

11. A method, comprising:

forming a gate stack above a semiconducting substrate, said gate stack comprised of a polysilicon gate electrode and a protective layer positioned above said gate electrode;

forming a plurality of source/drain regions in said substrate;

depositing a first layer of refractory metal above said source/drain regions and said protective layer;

performing at least one anneal process to convert a portion of said first layer of refractory metal to a first metal silicide region on each of said source/drain regions;

introducing an oxygen containing gas during at least some portion of said at least one anneal process to form a layer of silicon dioxide above each of said first metal silicide regions to thereby free at least some metal atoms in the first metal silicide regions to diffuse through at least a portion of said first metal silicide regions and form a metal silicide at an interface between the substrate and the first metal silicide regions;

removing said protective layer from above said gate electrode;

depositing a second layer of refractory metal above said layers of silicon dioxide and said gate electrode; and performing at least one anneal process to convert a portion of said second layer of refractory metal to a second metal silicide region on said gate electrode.

12. The method of claim 11, wherein forming a gate stack above a semiconducting substrate, said gate stack comprised of a polysilicon gate electrode and a protective layer positioned above said gate electrode, comprises:

depositing a layer of polysilicon above a surface of a substrate;

depositing a protective layer above said gate electrode layer; and etching said layer of polysilicon and said protective layer to define a gate stack comprised of a gate electrode and a protective layer above said gate electrode.

13. The method of claim 12, wherein said protective layer is comprised of at least one of silicon nitride and silicon oxynitride above said gate electrode layer.

14. The method of claim 11, wherein forming a plurality of source/drain regions in said substrate comprises performing at least one ion implantation process to form a plurality of source/drain regions on said substrate.

15. The method of claim 11, wherein depositing a first layer of refractory metal above said source/drain regions and said protective layer comprises depositing a first layer of refractory metal comprised of at least one of cobalt, tantalum, tungsten, molybdenum, platinum, and nickel above said source/drain region and said protective layer.

16. The method of claim 11, wherein removing said protective layer from above said gate electrode comprises performing a selective etching process to remove said protective layer from above said gate electrode.

17. The method of claim 11, wherein performing at least one anneal process comprises performing a rapid thermal anneal process at a temperature ranging from approximately 750–900° C. in an oxygen-containing environment.

18. The method of claim 11, wherein forming a second metal silicide region above said gate electrode comprises forming a second metal silicide region above said gate electrode, said second metal silicide region being of the same composition as said first metal silicide region.

19. The method of claim 11, wherein forming a second metal silicide region above said gate electrode comprises forming a second metal silicide region above said gate electrode, said second metal silicide region being of a different composition as said first metal silicide region.

20. The method of claim 11, wherein introducing an oxygen containing gas during at least some portion of said at least one anneal process to form a layer of silicon dioxide above each of said first metal silicide regions comprises introducing an oxygen containing gas during at least some portion of said at least one anneal process to form a layer of silicon dioxide having a thickness ranging from approximately 20–100 Å above each of said first metal silicide regions.

21. The method of claim 11, wherein said second metal silicide region on said gate electrode is comprised of at least one of cobalt silicide, titanium silicide, nickel silicide and platinum silicide.

* * * * *